United States Patent [19]
Ushiyama et al.

[11] Patent Number: 5,329,416
[45] Date of Patent: Jul. 12, 1994

[54] ACTIVE BROADBAND MAGNETIC FLUX RATE FEEDBACK SENSING ARRANGEMENT

[75] Inventors: Randall K. Ushiyama, Torrance, Calif.; Michael K. Scruggs, Pompton Plains, N.J.; Eric C. Mathisen, Brooklyn, N.Y.; Eric Hahn, Woodcliff Lake, N.J.

[73] Assignee: AlliedSignal Inc., Morris Township, Morris County, N.J.

[21] Appl. No.: 86,579

[22] Filed: Jul. 6, 1993

[51] Int. Cl.⁵ .................................. G01R 33/02
[52] U.S. Cl. ......................... 361/146; 324/207.17; 324/207.12; 324/260
[58] Field of Search ............ 324/207.12, 207.16, 324/207.17, 207.26, 225, 233, 239, 258, 259, 260; 340/568; 361/146, 143; 318/652, 653, 632, 128, 460, 811, 623; 310/51

[56] References Cited
U.S. PATENT DOCUMENTS

| | | | |
|---|---|---|---|
| 3,936,739 | 2/1976 | Hogg | 324/225 |
| 3,967,064 | 6/1976 | Sigworth | 324/207.17 |
| 4,191,922 | 3/1980 | Harris et al. | 324/225 |
| 4,567,435 | 1/1986 | Yamada et al. | 324/207.16 |
| 4,904,921 | 2/1990 | DeVito et al. | 324/207.18 |
| 5,013,987 | 5/1991 | Wakui | 318/632 |
| 5,066,911 | 11/1991 | Hulsing, II | 324/207.18 |
| 5,107,210 | 4/1992 | Shirao et al. | 324/207.12 |
| 5,130,589 | 7/1992 | Kanemitsu | 324/207.12 |

Primary Examiner—Marc S. Hoff
Assistant Examiner—Peter Ganjoo
Attorney, Agent, or Firm—Howard G. Massung

[57] ABSTRACT

An arrangement using sensing coils for obtaining flux rate of change information in a magnetic circuit. The arrangement can be used for vibration attenuation in a magnetic forcer system. Active (electric powered) circuitry is used to implement closed loop control of flux rate. The control loop is "broadband" since a broad range of vibration frequencies are attenuated. The arrangement can be applied to magnetic forcer/suspension systems in which vibrations due to magnetic mechanical/magnetic runouts, system mechanical resonances, or external vibration sources are present. The arrangement is particularly applicable for systems with a large number of varying vibration frequencies.

10 Claims, 5 Drawing Sheets

TO BROAD BAND
COMPENSATOR
INTEGRATOR 22
(FIG. 2)

ACTIVE BROADBAND MAGNETIC FLUX RATE FEEDBACK SENSING ARRANGEMENT

CROSS REFERENCE TO RELATED APPLICATION

This application is related to commonly assigned co-pending U.S. application Ser. No. (File No. 246-92-009) entitled Active Tuned Magnetic Flux Rate Feedback Sensing Arrangement filed by the present inventors on even date herewith.

BACKGROUND OF THE INVENTION

This invention relates to an arrangement for obtaining flux rate of change information in a magnetic circuit such as may be used for vibration attenuation in a magnetic forcer system.

Passive arrangements for the purpose described include spring/mass systems, mechanical dampers and hybrid viscoelastic devices. Active arrangements may be open or closed loop and may include forcer elements or drive elements such as piezoceramic elements, pneumatic/hydraulic drives, or electromagnetic devices which, when used in conjunction with appropriate sensing elements, can be used to actively accomplish the aforenoted vibration attenuation.

In an active open loop configuration, a command matching the vibration to be attenuated as a function of time is applied to the forcer element. This configuration works well when the vibration dynamics can be modeled accurately. Alternatively, an active closed loop arrangement can be employed, whereby the vibration is sensed and the sensed information is used to adjust a command matching the vibration.

The present invention is similar to the above described active closed loop arrangement which uses "Hall Effect" devices to measure magnetic flux within an air gap. These devices are operative so that presence of a magnetic field of a proper orientation induces a small voltage in a semiconductor device. The Hall Effect arrangement uses flux as the sensed parameter for vibration attenuation. The present invention, on the other hand, uses flux rate for this purpose.

Accordingly, it is the object of the present invention to use a closed loop or feedback arrangement for sensing flux rate of change in a magnetic circuit.

SUMMARY OF THE INVENTION

This invention contemplates an active broadband magnetic flux rate feedback sensing arrangement wherein a magnetic circuit includes a sensor element and a forcer or drive element in the form of wound wire coils for providing a magnetic flux path. The sensor output is dictated by a command to the forcer element and is conditioned to provide a flux rate output.

A broadband compensator integrator applies proportional plus integral characteristics to the flux rate output. Since the flux rate output is poor at low frequencies, a bias trim loop is required to prevent the broadband compensator integrator from "winding up" i.e. becoming saturated. The bias trim loop effectively restricts the authority of the broadband compensator at low frequencies and forces a command signal to match a feedback signal.

DETAILED DESCRIPTION OF THE INVENTION

Figure 1:
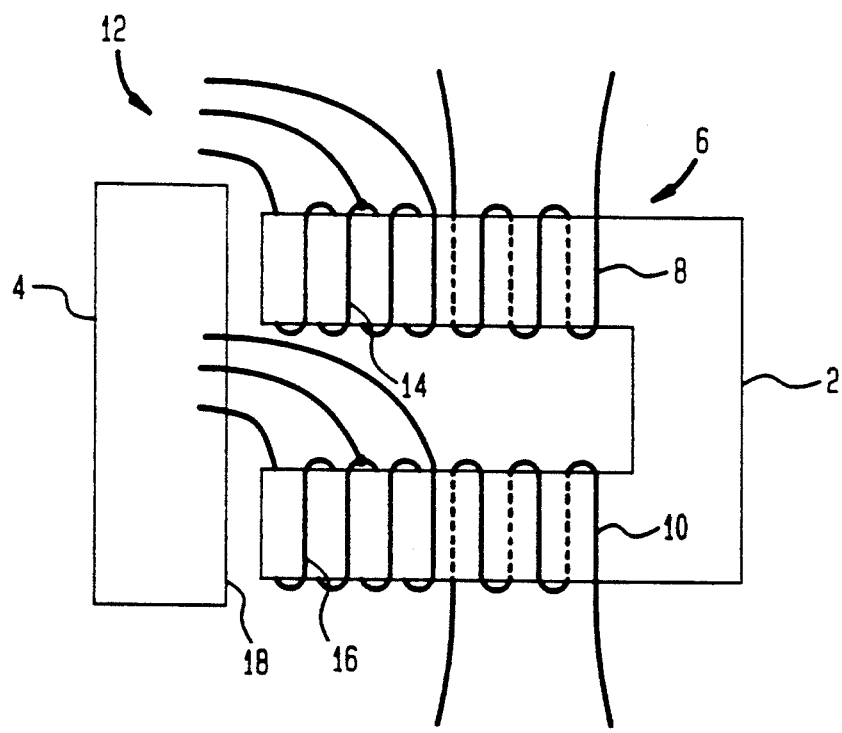
FIG. 1 is a diagrammatic representation illustrating a magnetic circuit according to the invention.

With reference first to FIG. 1, the orientation of a flux rate sensing coil in relation to a drive or forcer coil in a magnetic circuit is illustrated. Thus, a stator is designated by the numeral 2 and a rotor is designated by the numeral 4. Stator 2 carries a drive coil 6 having legs 8 and 10 and carries a sensor coil 12 having legs 14 and 16.

Legs 14 and 16 of sensor coil 12 are disposed close to an air gap 18 between stator 2 and rotor 4. With this arrangement, magnetic flux induced in stator 2 moves from the stator to rotor 4 and then back to the stator with minimal pick-up of stray leakage magnetic flux fields in the magnetic circuit.

Figure 2:
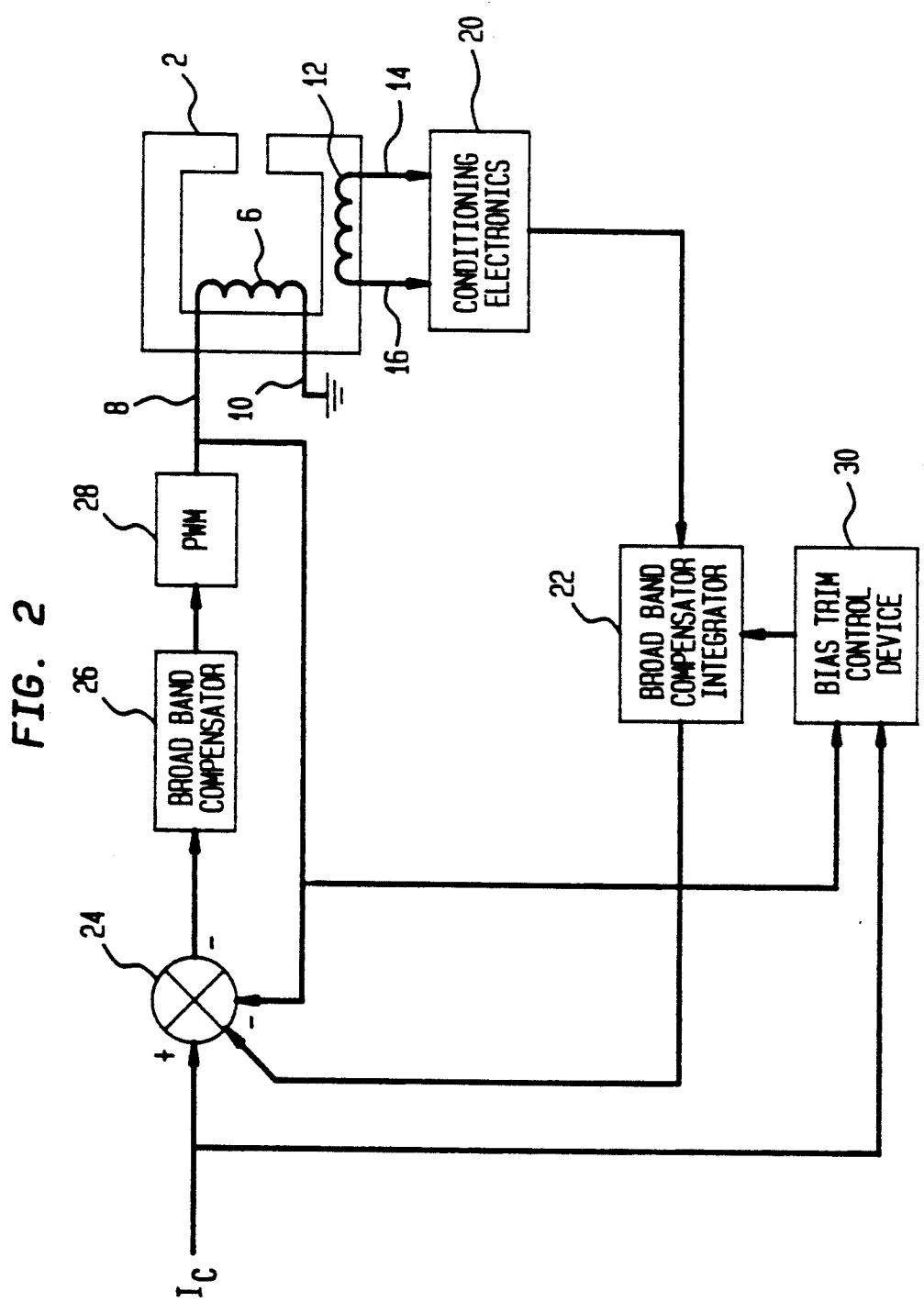
FIG. 2 is a block diagram illustrating a broadband flux rate feedback sensor configuration according to the invention.

With reference to FIG. 2, sensor coil legs 14 and 16 are connected to conditioning electronics 20. Conditioning electronics 20 provides a flux rate signal which is applied to a broadband compensator integrator 22.

The signal from broadband compensator integrator 22, which is a flux rate feedback signal, is applied to a summing device 24. A command signal $I_c$ provided as will be hereinafter described is applied to summing device 24 and is applied to a bias trim control device 30.

Summing device 24 sums the signal from broadband compensator integrator 22 with command signal $I_c$ and provides a summed signal which is applied to a broadband compensator 26 and therefrom to a pulse width modulator (PWM) 28 which is connected to one of the legs such as 8 of drive coil 6 for energizing the drive coil. A transconductance power amplifier which may be of the linear or switching pulse width modulated type may be used in place of pulse width modulator 28 as dictated by a particular application of the invention.

The signal from pulse width modulator 28 is fed back to summing means 24 so as to be summed thereby with command signal $I_c$. The signal from broadband compensator integrator 22 is applied to summing means 24. Command signal $I_c$ is applied to bias trim control device 30 which is responsive to the signals applied thereto for controlling broadband compensator integrator 22. A closed loop configuration is thus provided.

With the arrangement described, a signal is induced in sensor coil 12 due to the rate of change of magnetic flux and is used in a "broadband" closed loop configuration. The signal at the output of sensor coil 12 is N (the number of sensor coil turns) times the rate of change of flux. This signal is processed by conditioning electronics 20 and broadband compensator integrator 22. The processed signal is then fed back to a drive command loop including summing means 24, broadband compensator 26 and pulse width modulator 28. A bias trim control loop including bias trim control device 30 is used to prevent saturation of broadband compensator integrator 22.

Figure 3:
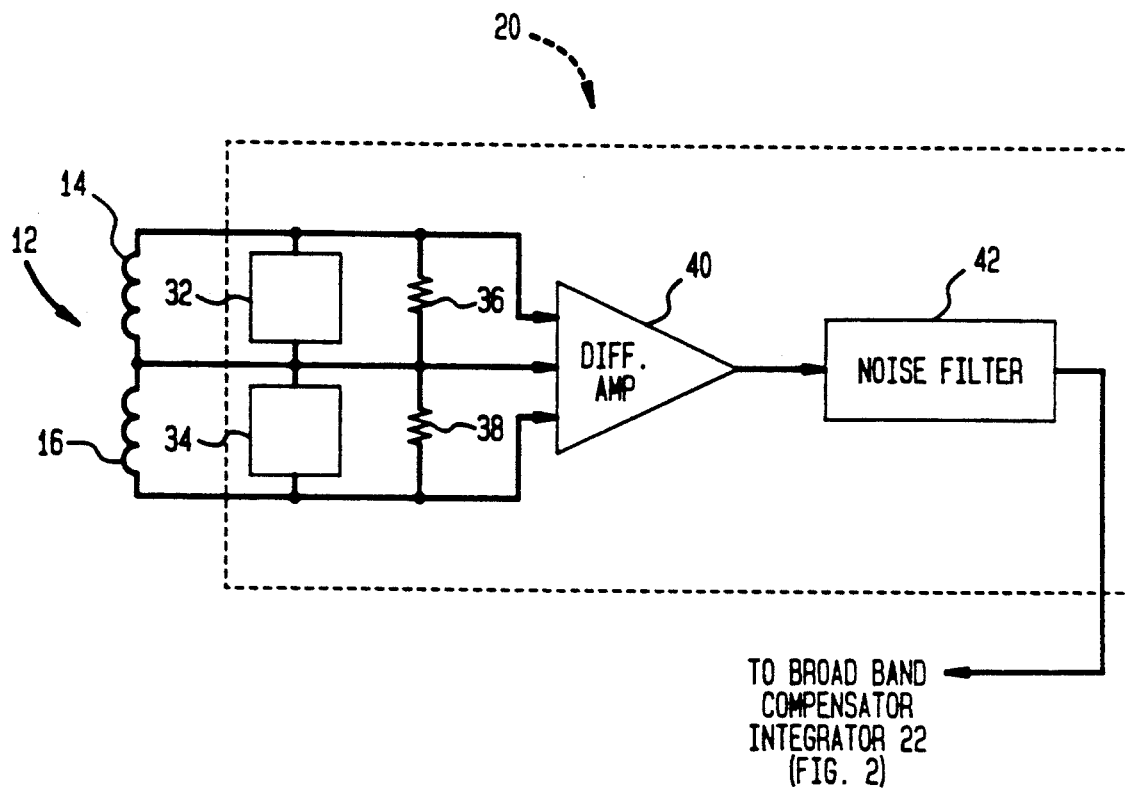
FIG. 3 is a circuit diagram more specifically illustrating conditioning electronics shown generally in FIG. 2.

The arrangement including conditioning electronics 20 shown generally in FIG. 2 is shown more specifically in FIG. 3 and includes overload protection devices 32 and 34, load resistors 36 and 38, a differential amplifier 40 and a noise filter 42.

Overload protection device 32 is connected across leg 14 of sensor coil 12 and overload protection device 34 is connected across leg 16 of the sensor coil. Overload protection devices 32 and 34 may be diodes. Load resistor 36 is connected across overload protection device 32 and load resistor 38 is connected across overload protection device 34. The signal from sensor coil 12 is applied through overload protection devices 32 and 34 and load resistors 36 and 38 to a differential amplifier 40 and therefrom through high frequency noise filter 42 which provides a filtered signal. The filtered signal is applied to broadband compensator integrator 22 as shown in FIG. 2. This arrangement is useful for preventing switching noise from pulse width modulator 28 (FIG. 2) from interfering with the operation of the closed loop configuration heretofore described.

Differential amplifier 40 rejects common mode voltages that may be present due to operation of pulse width modulator 28, IR drops, or other non-linear effects. Load resistors 36 and 38 are selected in conjunction with overload protection devices 32 and 34, respectively, to limit peak loads.

Figure 4:
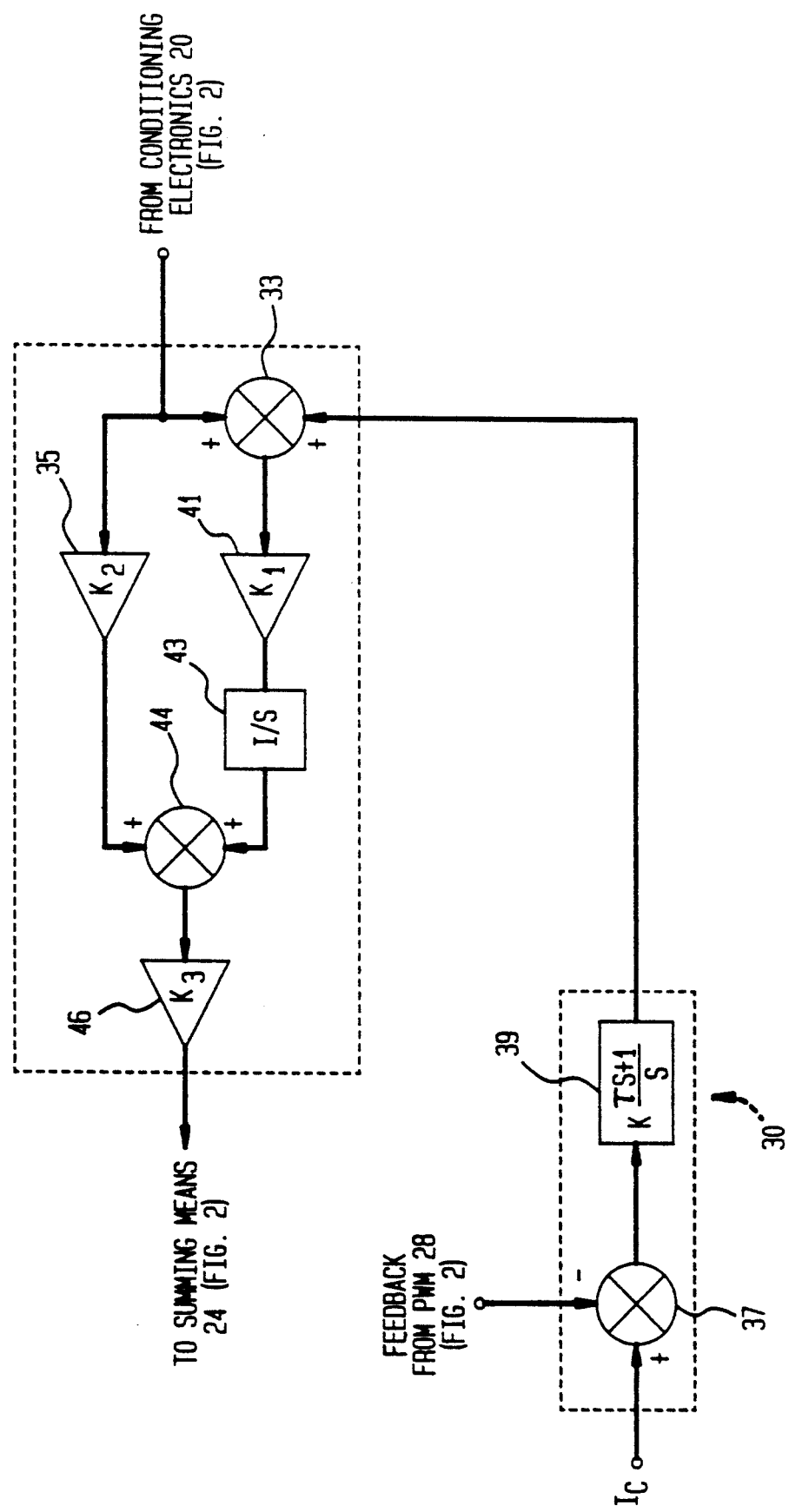
FIG. 4 is a block diagram more specifically illustrating a broadband compensator integrator and a bias trim control device shown generally in FIG. 2.

The arrangement including broadband compensator integrator 22 and bias trim control device 30 shown generally in FIG. 2 is shown more specifically in FIG. 4. Broadband compensator integrator 22 applies proportional plus integral factors to the flux rate signal received thereby from conditioning electronics 20 (FIG. 2). Since the flux rate signal is poor at low frequencies, bias trim control as provided by bias trim control device 30 is required to prevent the broadband compensator integrator from "winding up", i.e. becoming saturated. Bias trim control device 30 effectively restricts the authority of the broadband compensator integrator at low flux rate signal frequencies.

To this extent, broadband compensator integrator 22 receives the flux rate signal from conditioning electronics 20 (FIG. 2) and which flux rate signal is applied to a summing means 33 and to an amplifier 35 having a gain factor $K_2$. Bias trim control device 30 receives feedback from pulse width modulator 28 (FIG. 2) and command signal $I_c$, and which feedback and command signal are applied to a summing means 37. The output from summing means 37 is applied to a compensating integrator 39 included in bias trim control device 30. Compensating integrator 39 has a compensating integrating factor $K(ts + 1/S)$.

The output from compensating integrator 39 is applied to summing means 33 in broadband compensator integrator 22 and is summed thereby with the flux rate signal from conditioning electronics 20.

Broadband compensator integrator 22 further includes an amplifier 41 having a gain factor $K_1$, an integrator 43 having an integrating factor $1/S$, a summing means 44 and an amplifier 46 having a gain factor $K_3$.

The signal from summing means 33 is applied to amplifier 41 and therefrom to integrator 43. The integrated signal is applied to summing means 44 where it is summed thereby with the signal from amplifier 35. The signal from summing means 44 is applied to amplifier 46 which provides the signal which is applied to summing means 24 (FIG. 2).

The flux rate feedback signal from broadband compensator integrator 22, and which signal is applied to summing means 24 as heretofore noted, has some sensitivity due to variations in gap 18 between stator 2 and rotor 4 (FIG. 1). These, in effect, are scale factor variations in the flux rate loop and can be corrected using gap information. This correction is implemented as particularly shown in FIG. 5.

Figure 5:
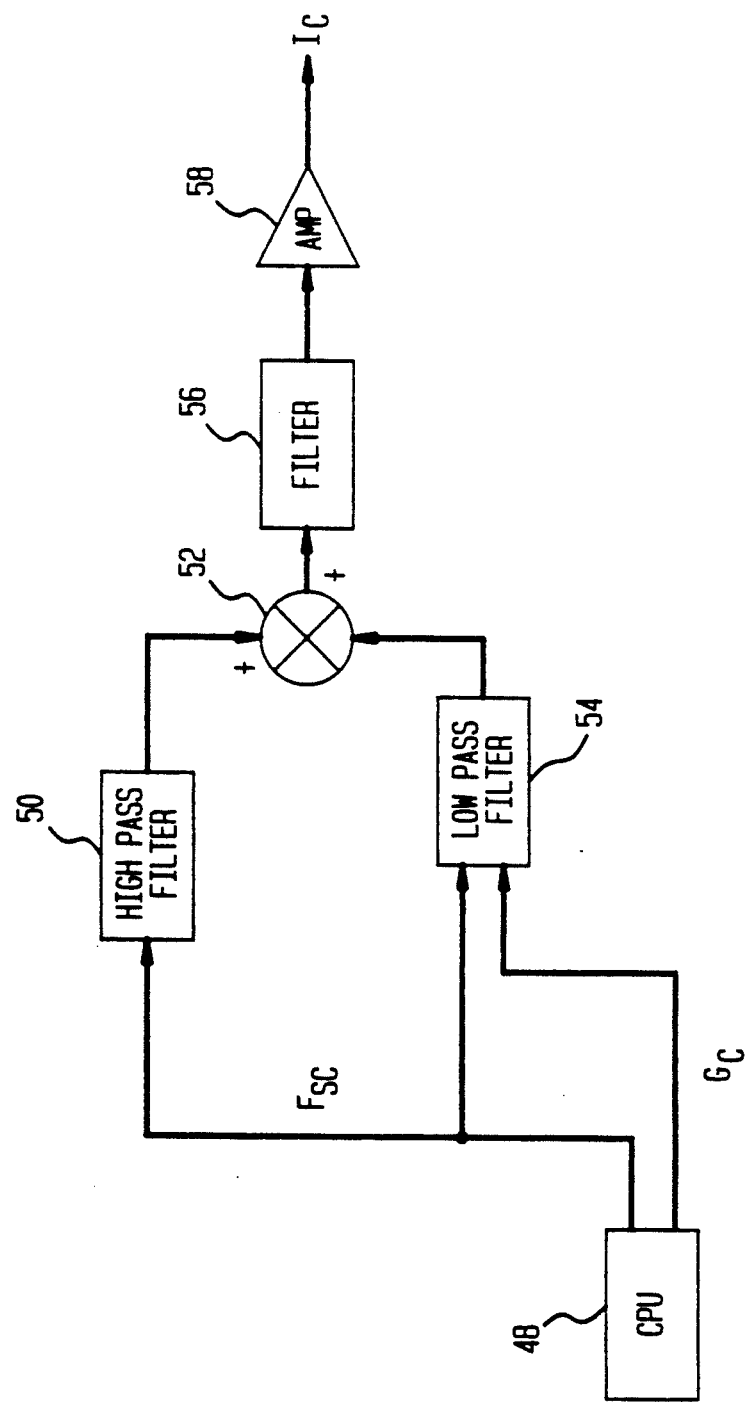
FIG. 5 is a block diagram illustrating an arrangement for correcting outputs due to variations in the gap between the stator and rotor in the magnetic circuit of FIG. 1.

To this extent, and with reference to FIG. 5, a central processing unit designated by the numeral 48 provides a signal corresponding to a scaled flux command $F_{sc}$ and a signal $G_c$ corresponding to the ratio of a sensed change in gap 18 between stator 2 and rotor 4 and a nominal gap, and which output is designated as $G_c$.

Signal $F_{sc}$ is a high bandwidth signal which is applied to a high pass filter 50 and therefrom to a summing means 52 and is applied to a low pass filter 54. Signal $G_c$ is a low bandwidth signal which is applied to low pass filter 54 and provides a scaling factor for the output of low pass filter 54 commensurate with the gap between stator 2 and rotor 4. Summing means 52 sums the signals from filters 50 and 54 and provides a summed signal which is applied to a filter 56 and therefrom to an amplifier 58. The output from amplifier 58 is command signal $I_c$.

Thus, low frequency gap (low pass) information is combined with high frequency command input (high pass) information Using a complimentary filter arrangement.

Figure 6:
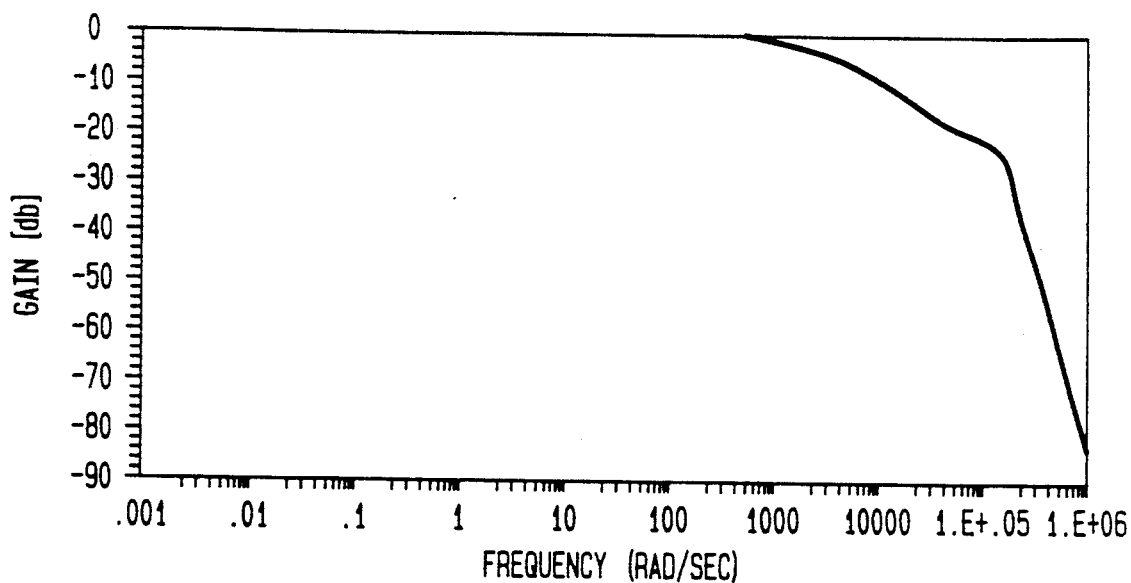
FIG. 6 is a graphical representation illustrating a high bandwidth constant output current to flux relationship resulting from the implementation of the invention illustrated in FIGS. 1–5.
Figure 7:
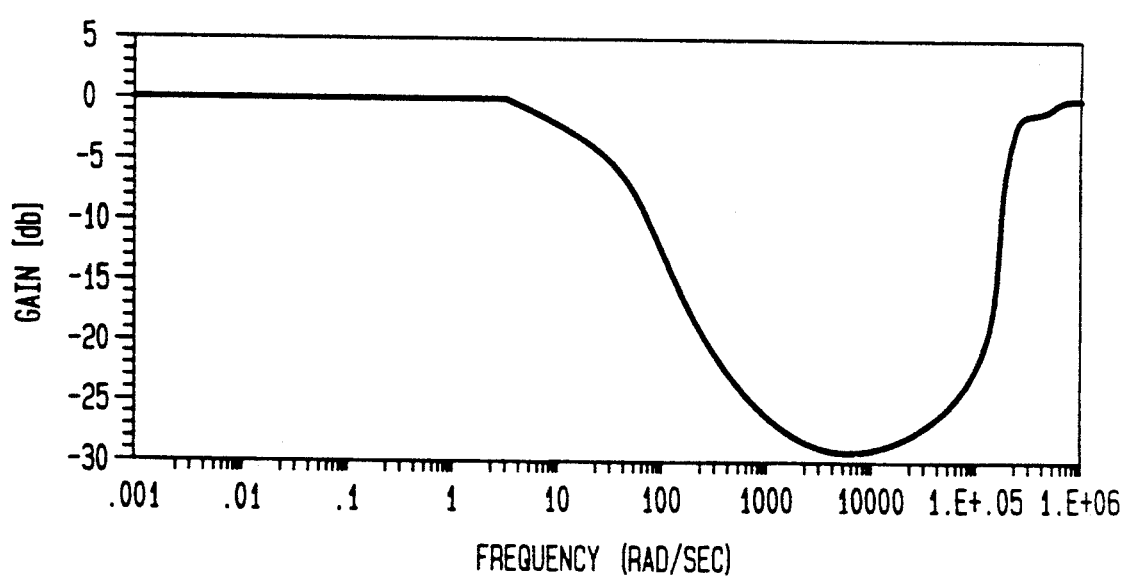
FIG. 7 is a graphical representation illustrating the attenuation of variations in flux rate which are not the result of a flux rate command.

The implementation described above results in a high bandwidth constant output flux relationship as particularly shown in FIG. 6 which is a plot of frequency v. gain. However, variations in flux rate that are not the result of a flux rate command are significantly attenuated as particularly shown in FIG. 7 which is a plot of vibration attenuation. In this regard, the broad range of frequency rejection with the described implementation is noted.

It will now be appreciated that flux rate feedback using sensing coils as in the present invention provides superior vibration attenuation compared to prior art Hall Effect devices at frequencies greater than zero. In this regard, it will be noted that the voltage obtained from a Hall Effect device is typically small and must be amplified with a high gain device. This makes such an arrangement susceptible to noise which is obviated by the present invention. In further contrast to the prior art Hall Effect devices, said devices are typically limited to a temperature range less than ninety to one hundred and twenty degrees Celsius. Further, the Hall Effect devices require both temperature correction and calibration for non-linear effects and a precision current source is required. The present invention obviates these requirements while providing a flux rate sensor which is relatively simple and does not require calibration.

With the above description of the invention in mind, reference is made to the claims appended hereto for a definition of the scope of the invention.

What is claimed is:

1. An active broadband magnetic flux rate feedback sensing arrangement, comprising:

a magnetic circuit including a rotor and a stator, the stator carrying a drive coil and a sensor coil;

the stator and rotor cooperatively arranged so that a signal is induced in the sensor coil and the sensor coil provides a signal proportional to the rate of change of flux in the magnetic circuit;

means connected to the sensor coil for processing the flux rate of change signal therefrom and for providing a processed flux rate of change signal;

means for providing a command signal;

means connected to the processing means and to the command signal means for combining the processed flux rate of change signal and the command signal and for providing a combined signal;

compensating means connected to the combining means for applying broadband compensation to the combined signal and for providing a compensated combined signal;

modulating means connected to the compensating means for modulating the compensated combined signal and for providing a modulated compensated combined signal;

the drive coil connected to the modulating means for being energized by the modulated signal therefrom; and the modulating means connected to the combining means for applying the modulated compensated combined signal thereto, whereby the modulated compensated combined signal is combined with the command signal and the processed flux rate of change signal for providing the combined signal.

2. An arrangement as described by claim 1, wherein the processing means includes:

conditioning means connected to the sensor coil for inhibiting the affect of noise from the modulating means on the signal provided by the sensor coil, and for providing an inhibited signal; and means connected to the conditioning means for receiving the inhibited signal therefrom to apply a proportional plus integral factor to said inhibited signal and for providing the processed signal.

3. An arrangement as described by claim 2, including:

control means for receiving the command signal and the modulated compensated combined signal and responsive to said signals for providing a control signal; and the means for providing a proportional plus integral factor to said inhibited signal and for providing the processed signal connected to the control means and controlled by the control signal provided thereby so as to have a restricted effectivity on low frequency inhibited signals.

4. An arrangement as described by claim 2, wherein the conditioning means includes:

overload protection means connected to the sensor coil;

means connected to the overload protection means for rejecting common mode components in the signal from the sensor coil; and filter means connected to the common mode component rejection means for filtering the signal therefrom and for providing the inhibited signal.

5. An arrangement as described by claim 1, wherein the means for providing a command signal includes:

means for providing a signal corresponding to a scaled flux command;

means for providing a signal corresponding to the ratio of a sensed change in a gap between the rotor and the stator and a nominal gap;

means for filtering the scaled flux command signal and for providing a first filtered signal;

means for filtering the scaled flux command signal and gap ratio signal and for providing a second filtered signal which is scaled by the gap ratio signal commensurate with the gap between the rotor and the stator;

means for combining the first and second filtered signals and for providing a combined filtered signal;

means for filtering the combined filtered signal to provide a third filtered signal; and means for adjusting the gain of the third filtered signal for providing the command signal.

6. An arrangement as described by claim 5, wherein: the means for providing the first filtered signal is a high pass filter.

7. An arrangement as described by claim 5, wherein: the means for providing the second filtered signal is a low pass filter.

8. An arrangement as described by claim 5, wherein:
   the means for providing the first filtered signal is a high pass filter; and
   the means for providing the second filtered signal is a low pass filter.

9. A method for sensing flux rate of change in a magnetic circuit, comprising:

supporting a drive coil and a sensor coil on a stator;
   arranging the stator and a rotor in a magnetic circuit for inducing a signal in the sensor coil which is proportional to the rate of change of flux in the magnetic circuit;
   processing the flux rate of change signal;
   providing a command signal;
   combining the processed flux rate of change signal and the command signal;
   applying broadband compensation to the combined flux rate of change signal and the command signal;
   modulating the compensated combined signal;
   using the modulated compensated combined signal for energizing the drive coil; and
   combining the modulated compensated combined signal with the command signal and the processed flux rate of change signal for providing the combined signal.

10. A method as described by claim 9, wherein processing the flux rate of change signal includes:
   inhibiting the effect of noise on the flux rate of change signal; and
   applying a proportional flux integral factor to the inhibited signal.

* * * * *